United States Patent
Pai et al.

(10) Patent No.: US 12,483,027 B2
(45) Date of Patent: Nov. 25, 2025

(54) TRANSISTOR STACK CIRCUIT

(71) Applicant: RichWave Technology Corp., Taipei (TW)

(72) Inventors: Ching-Yao Pai, Taipei (TW); Yu-Hung Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 173 days.

(21) Appl. No.: 18/397,960

(22) Filed: Dec. 27, 2023

(65) Prior Publication Data

US 2025/0167542 A1    May 22, 2025

(30) Foreign Application Priority Data

Nov. 16, 2023 (TW) ................... 112144251

(51) Int. Cl.
*H02H 9/04* (2006.01)

(52) U.S. Cl.
CPC ............ *H02H 9/046* (2013.01); *H02H 9/044* (2013.01)

(58) Field of Classification Search
CPC ............................... H02H 9/046; H02H 9/044
See application file for complete search history.

(56) References Cited

U.S. PATENT DOCUMENTS

| | | | | |
|---|---|---|---|---|
| 6,803,680 B2 * | 10/2004 | Brindle | ................ | H03K 17/102 307/115 |
| 7,459,988 B1 * | 12/2008 | Iversen | ..................... | H01P 1/15 333/262 |
| 8,330,519 B2 * | 12/2012 | Lam | ........................ | H03K 5/003 327/365 |
| 8,461,903 B1 * | 6/2013 | Granger-Jones | ............................ | H03K 17/04123 327/427 |
| 10,056,895 B2 * | 8/2018 | Granger-Jones | ..... | H03K 17/102 |
| 10,886,911 B2 * | 1/2021 | Willard | ................ | H10D 86/201 |
| 11,569,812 B2 * | 1/2023 | Shapiro | ................ | H03K 17/687 |
| 11,658,657 B1 * | 5/2023 | Wang | .................. | H03K 17/6871 327/574 |
| 2004/0141266 A1 * | 7/2004 | Ker | ........................ | H10D 89/811 361/56 |

(Continued)

FOREIGN PATENT DOCUMENTS

| CN | 117614427 A | * | 2/2024 | ......... | H03K 17/04106 |
|---|---|---|---|---|---|
| CN | 119602764 A | * | 3/2025 | ......... | H03K 17/6871 |

(Continued)

*Primary Examiner* — Dharti H Patel
(74) *Attorney, Agent, or Firm* — JCIPRNET

(57) ABSTRACT

A transistor stack circuit including a first signal transmission port, a second signal transmission port, an impedance unit, a plurality of transistors, and a plurality of resistors is provided. The transistors are connected in series and coupled between the first signal transmission port and the second signal transmission port. A first terminal of each resistor is coupled to a common path. A second terminal of each resistor is coupled to a control terminal of a corresponding transistor among the transistors. The impedance unit is coupled between the common path and a reference voltage terminal. When an electrostatic discharge event occurs, an impedance value of the impedance unit is greater than twice of a resistance value of each resistor, and the transistors form a low-impedance path.

20 Claims, 10 Drawing Sheets

(56) References Cited

U.S. PATENT DOCUMENTS

| | | | |
|---|---|---|---|
| 2012/0154017 A1* | 6/2012 | Sugiura | H03K 17/693 |
| | | | 327/409 |
| 2014/0118053 A1* | 5/2014 | Matsuno | H03K 17/693 |
| | | | 327/427 |
| 2018/0316350 A1* | 11/2018 | Brindle | H03K 19/0005 |
| 2019/0173278 A1 | 6/2019 | Jang et al. | |
| 2019/0305768 A1* | 10/2019 | Willard | H01L 25/0657 |
| 2021/0391858 A1* | 12/2021 | Shapiro | H03K 17/693 |
| 2021/0408786 A1 | 12/2021 | Dundigal et al. | |
| 2022/0376493 A1 | 11/2022 | Liao et al. | |
| 2023/0170895 A1* | 6/2023 | Teraguchi | H03K 17/693 |
| | | | 327/574 |
| 2023/0335546 A1 | 10/2023 | Huang et al. | |
| 2024/0305294 A1* | 9/2024 | Pai | H03K 17/693 |

FOREIGN PATENT DOCUMENTS

| | | | | |
|---|---|---|---|---|
| EP | 4329199 A1 * | 2/2024 | | H10D 89/811 |
| JP | 2020205578 A * | 12/2020 | | H03K 17/6871 |
| KR | 20150038866 A * | 4/2015 | | H04B 1/44 |
| TW | 202131476 | 8/2021 | | |
| TW | 202139415 | 10/2021 | | |
| TW | 202205774 | 2/2022 | | |
| TW | 202318617 | 5/2023 | | |
| TW | 202324683 | 6/2023 | | |
| TW | 202327016 | 7/2023 | | |

\* cited by examiner

TRANSISTOR STACK CIRCUIT

CROSS-REFERENCE TO RELATED APPLICATION

This application claims the priority benefit of Taiwan application serial no. 112144251, filed on Nov. 16, 2023. The entirety of the above-mentioned patent application is hereby incorporated by reference herein and made a part of this specification.

BACKGROUND

Technical Field

The disclosure relates to an integrated circuit (IC), and particularly relates to a transistor stack circuit.

Description of Related Art

Many factors that cause electrical overstress (EOS) to damage integrated circuits include electrostatic discharge (ESD). The ESD may permanently damage semiconductor components in the integrated circuit, thereby affecting a function of the integrated circuit (or the integrated circuit even fails to work properly). Therefore, how to prevent the ESD from damaging the integrated circuit is one of many technical issues in this field.

SUMMARY

The disclosure is directed to a transistor stack circuit to prevent electrostatic discharge (ESD) from damaging an integrated circuit.

In an embodiment of the disclosure, the transistor stack circuit includes a first signal transmission port, a second signal transmission port, an impedance unit, a plurality of transistors, and a plurality of first resistors. The transistors are connected in series and coupled between the first signal transmission port and the second signal transmission port. A first terminal of each first resistor is coupled to a common path. A second terminal of each first resistor is coupled to a control terminal of a corresponding transistor in the transistors. The impedance unit is coupled between the common path and a reference voltage terminal. When an electrostatic discharge event occurs, an impedance value of the impedance unit is greater than twice of a resistance value of each first resistor, and the transistors form a low-impedance path.

In an embodiment of the disclosure, the transistor stack circuit includes a first signal transmission port, a second signal transmission port, an impedance unit, a plurality of transistors, and a plurality of first resistors. The transistors are connected in series and coupled between the first signal transmission port and the second signal transmission port. The transistors include a first transistor, a second transistor and a terminal transistor. A first terminal of the first transistor is coupled to the first signal transmission port. A second terminal of the first transistor is coupled to a first terminal of the second transistor. A second terminal of the terminal transistor is coupled to the second signal transmission port. Each first resistor has a first terminal and a second terminal. The first terminals of the first resistors are coupled to a common path. The second terminal of each first resistor is coupled to a control terminal of a corresponding transistor in the transistors. The impedance unit is coupled between the common path and a reference voltage terminal. When an electrostatic discharge event occurs, a voltage difference between the control terminal of the second transistor and the second terminal of the second transistor is greater than a turn-on voltage of the second transistor.

Based on the above descriptions, the impedance unit described in the embodiments of the disclosure may effectively turn on each of the transistors connected in series when an ESD event occurs, thereby allowing the transistors to transmit an ESD current between the first signal transmission port and the second signal transmission port. Therefore, the transistor stack circuit may prevent ESD from damaging an integrated circuit.

To make the aforementioned more comprehensible, several embodiments accompanied with drawings are described in detail as follows.

DESCRIPTION OF THE EMBODIMENTS

Figure 1:
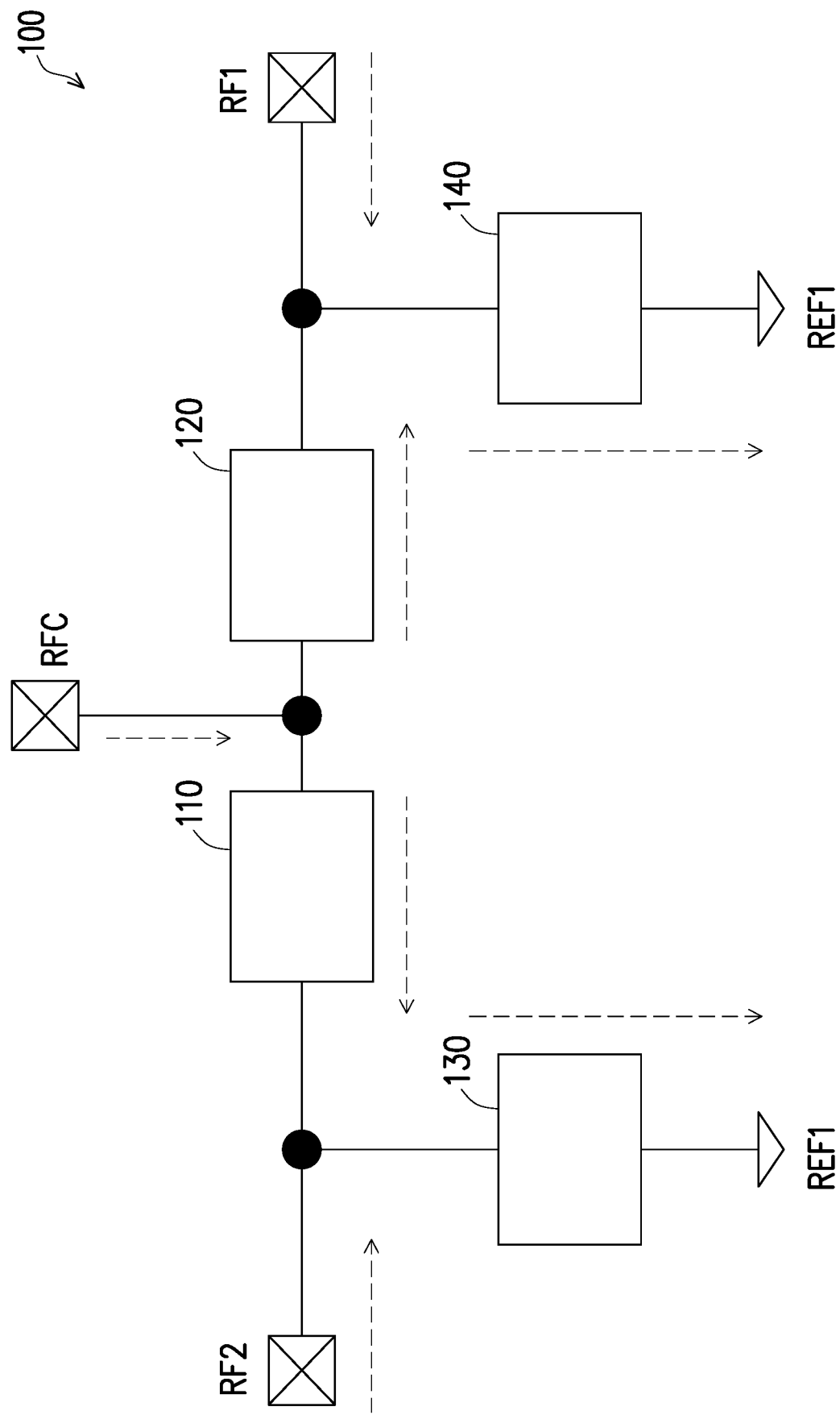
FIG. 1 is a schematic circuit block diagram of an RF integrated circuit according to an embodiment of the disclosure.

A term "couple (or connect)" used in the full text of the disclosure (including the claims) refers to any direct and indirect connections. For example, if a first device is described to be coupled (or connected) to a second device, it is interpreted as that the first device is directly coupled to the second device, or the first device is indirectly coupled to the second device through other devices or connection means. "First", "second", etc. mentioned in the specification and the claims are merely used to name the elements and should not be regarded as limiting the upper or lower bound of the number of the components/devices, nor are they used to limit the order of the components. Moreover, wherever possible, components/members/steps using the same referential numbers in the drawings and description refer to the same or like parts. Components/members/steps using the same referential numbers or using the same terms in different embodiments may cross-refer related descriptions.

Based on an actual design, a transistor stack circuit described in the specification may be applied to any integrated circuit (IC). When an electrostatic discharge (ESD) event occurs, the transistor stack circuit may prevent ESD from damaging the integrated circuit. For example, the transistor stack circuit described in the specification may be applied to a radio frequency (RF) integrated circuit 100 shown in FIG. 1 or other integrated circuits.

FIG. 1 is a schematic circuit block diagram of the RF integrated circuit 100 according to an embodiment of the disclosure. The RF integrated circuit 100 shown in FIG. 1 includes an RF switch series path 110, an RF switch series path 120, an RF switch shunt path 130 and an RF switch shunt path 140. For the sake of simplicity, FIG. 1 does not depict other circuits/components except the RF switch series path 110, the RF switch series path 120, the RF switch shunt path 130 and the RF switch shunt path 140, and the other circuits/components may be arbitrarily arranged according to an actual design. First terminals of the RF switch series paths 110 and 120 are coupled to an RF connection pad RFC. An RF connection pad RF2 is coupled to ae second terminal of the RF switch series path 110 and a first terminal of the RF switch shunt path 130. An RF connection pad RF1 is coupled to a second terminal of the RF switch series path 120 and a first terminal of the RF switch shunt path 140. The RF connection pads RFC, RF1 and/or RF2 may be bonding pads or other types of connection pads. Second terminals of the RF switch shunt paths 130 and 140 are coupled to a reference voltage terminal REF1. Based on an actual design, the reference voltage terminal REF1 may be a ground voltage terminal or other fixed voltage terminal.

Under a normal operation, the RF switch series paths 110 and 120 may be used as signal transmission paths (for example, for transmitting signals or receiving signals); and the RF switch shunt paths 130 and 140 may be used as shunt-networks to increase isolation between different signal paths. The transistor stack circuit described in the specification may be applied to one or more of the RF switch series path 110, the RF switch series path 120, the RF switch shunt path 130 and the RF switch shunt path 140. When an ESD event occurs at the RF connection pads RFC, RF1, and/or RF2, the ESD current may be conducted to the reference voltage terminal REF1 through the RF switch series path 110, the RF switch series path 120, the RF switch shunt path 130, and/or the RF switch shunt path 140. Therefore, the RF switch series path 110, the RF switch series path 120, the RF switch shunt path 130 and/or the RF switch shunt path 140 may prevent ESD from damaging the RF integrated circuit 100.

A plurality of implementation examples of the transistor stack circuit will be described below.

Figure 2:
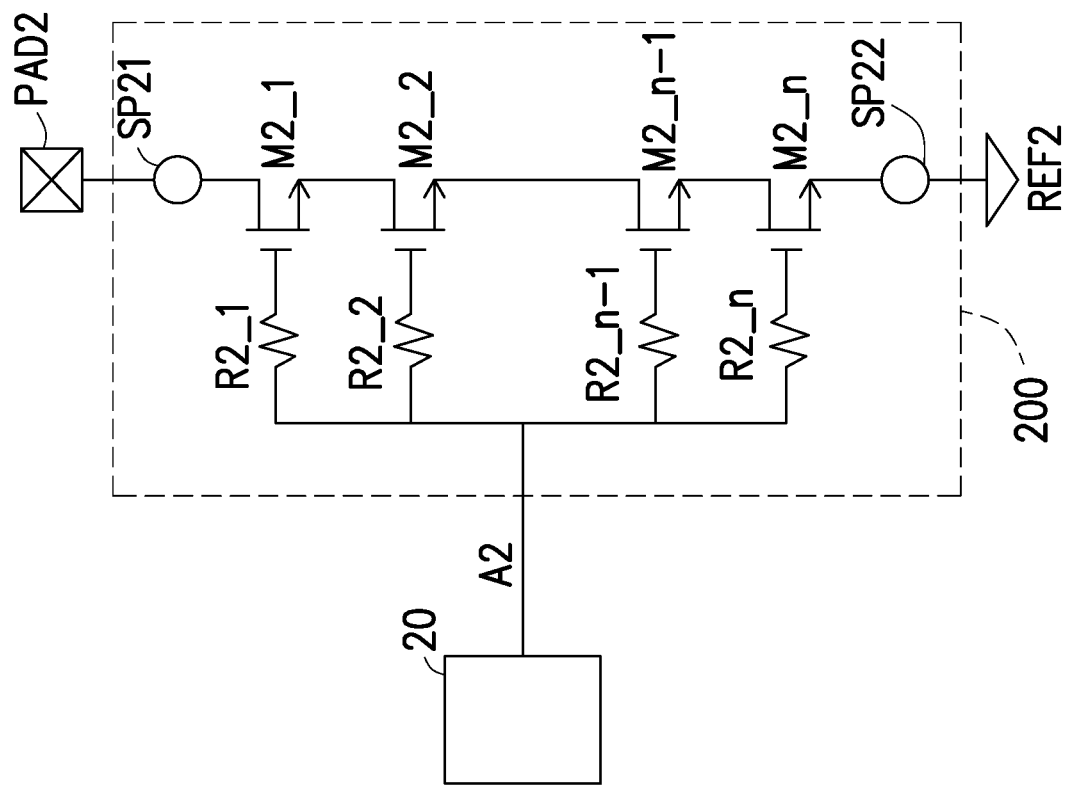
FIG. 2 is a schematic circuit diagram of a transistor stack circuit according to an embodiment.

FIG. 2 is a schematic circuit diagram of a transistor stack circuit 200 according to an embodiment. The transistor stack circuit 200 shown in FIG. 2 includes a signal transmission port SP21, a signal transmission port SP22, a plurality of transistors (such as the transistors M2_1, M2_2, . . . , M2_$n$–1, M2_$n$ shown in FIG. 2) and a plurality of resistors (such as resistors R2_1, R2_2, . . . , R2_$n$–1, R2_$n$ shown in FIG. 2). In some embodiments, a resistance value of each of the resistors R2_1-R2_$n$ is the same. In some other embodiments, sizes of the resistors R2_1-R2_$n$ may be different from each other.

The transistor stack circuit 200 shown in FIG. 2 may be applied to the RF switch series path 110, the RF switch series path 120, the RF switch shunt path 130 or the RF switch shunt path 140 shown in FIG. 1. For example, when the transistor stack circuit 200 shown in FIG. 2 is applied to the RF switch series path 110 shown in FIG. 1, the signal transmission ports SP21 and SP22 of the transistor stack circuit 200 respectively serve as a first terminal and a second terminal of the RF switch series path 110. Namely, the signal transmission port SP21 is coupled to the RF connection pad RFC (corresponding to a connection pad PAD2 in FIG. 2), and the signal transmission port SP22 is coupled to the RF switch shunt path 130. Furthermore, the signal transmission port SP22 is also coupled to the reference voltage terminal REF1 (corresponding to the reference voltage terminal REF2 in FIG. 2) through the RF switch shunt path 130. Alternatively, in other embodiments, the signal transmission port SP21 is coupled to the RF connection pad RFC (corresponding to the connection pad PAD2 in FIG. 2), and the signal transmission port SP22 may also be coupled to the RF connection pad RF2, so that the RF switch series path 110 serving as one section of the circuit in the RF integrated circuit 100, may not necessarily be connected to the reference voltage terminal REF1.

For another example, when the transistor stack circuit 200 shown in FIG. 2 is applied to the RF switch shunt path 130 shown in FIG. 1, the signal transmission ports SP21 and SP22 of the transistor stack circuit 200 are respectively used as a first terminal and a second terminal of the RF switch shunt path 130. Namely, the signal transmission port SP21 is coupled to the RF connection pad RFC (corresponding to the connection pad PAD2 in FIG. 2) through the RF switch series path 110, or the signal transmission port SP21 is coupled to the RF connection pad RF2 (corresponding to the connection pad PAD2 in FIG. 2). The signal transmission port SP22 is coupled to the reference voltage terminal REF1 (corresponding to the reference voltage terminal REF2 in FIG. 2).

In the embodiment shown in FIG. 2, the transistors M2_1-M2_$n$ are connected in series and coupled between the signal transmission ports SP21 and SP22. The transistors M2_1, M2_2, and M2_$n$ may be referred to as a first transistor, a second transistor, and a terminal transistor. A first terminal (for example, a drain) of the transistor M2_1 is coupled to the signal transmission port SP21. A second terminal (for example, a source) of the transistor M2_1 is coupled to a first terminal (for example, a drain) of the transistor M2_2. A second terminal of the transistor M2_$n$ is coupled to the signal transmission port SP22. A first terminal of each of the resistors R2_1-R2_$n$ is coupled to a common path A2. A second terminal of each of the resistors R2_1-R2_$n$ is coupled to a control terminal (for example, a gate) of one of the corresponding transistors M2_1-M2_$n$. For example, the first terminal of the resistor R2_2 is coupled to the common path A2, and the second terminal of the resistor R2_2 is coupled to the control terminal of the transistor M2_2.

Under normal operations, an internal circuit 20 (a functional circuit in the integrated circuit) may control the transistors M2_1-M2_$n$ through the common path A2, thereby turning on or turning off a path of the transistor stack circuit 200. The signal transmission port SP21 may transmit RF signals or other signals. The number n of the transistors M2_1-M2_$n$ may be determined based on an actual design. For example, the number n of the transistors M2_1-M2_$n$ may be 4 or a larger integer. Moreover, although the transistors M2_1-M2_$n$ shown in FIG. 2 are N-channel metal-oxide-semiconductor (NMOS) transistors, the embodiment does not limit the type of the transistors M2_1-M2_$n$. For example, in another embodiment, the transistors M2_1-M2_$n$ may be changed to P-channel metal-oxide-semiconductor (PMOS) transistors or other types of transistors.

Based on the actual design, in some embodiments, a size of each of the transistors M2_1-M2_$n$ is the same. In other embodiments, the sizes of the transistors M2_1-M2_$n$ may be different from each other.

When an ESD event occurs on the connection pad PAD2, an ESD voltage on the connection pad PAD2 may be coupled to the gate of transistor M2_1 through a parasitic capacitance between the gate and drain of the transistor M2_1, thereby turning on the transistor M2_1 (since a voltage Vgs between the gate and source of the transistor M2_1 is greater than a threshold voltage). Then, the ESD voltage of the connection pad PAD2 may further increase a voltage of the common path A2, thereby turning on the other transistors M2_2-M2_$n$. Therefore, the turned-on transistors M2_1-M2_$n$ may transmit an ESD current between the signal transmission ports SP21 and SP22, thereby preventing ESD from damaging the integrated circuit.

However, when the ESD event occurs on the connection pad PAD2, the internal circuit 20 may have a small internal resistance. In this case, the voltage of the common path A2 may be pulled down to a voltage close to a voltage of the reference voltage terminal (for example, 0 volt), and thus the gate voltages of the other transistors M2_2-M2_$n$ are pulled down to be close to 0 volt, so that the transistors M2_2-M2_$n$ cannot be completely turned on. Therefore, when the ESD event occurs on the connection pad PAD2, the ESD protection capability provided by the transistor stack circuit 200 will be reduced, or the transistor stack circuit 200 may even lose the ESD protection capability.

Figure 3:
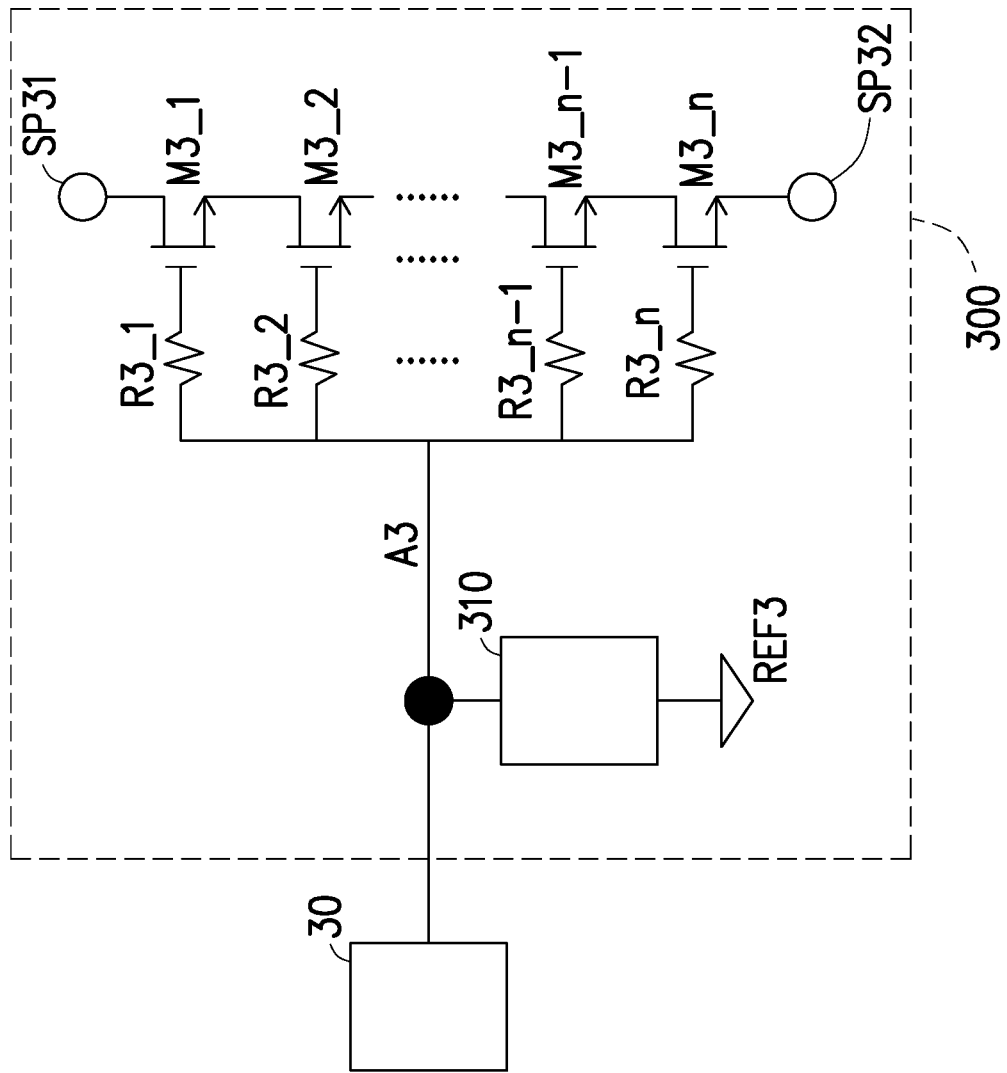
FIG. 3 is a schematic circuit diagram of a transistor stack circuit according to an embodiment of the disclosure.

FIG. 3 is a schematic circuit diagram of a transistor stack circuit 300 according to an embodiment of the disclosure. The transistor stack circuit 300 shown in FIG. 3 includes a signal transmission port SP31, a signal transmission port SP32, an impedance unit 310, a plurality of transistors (such as transistors M3_1, M3_2, ..., M3_$n$−1, M3_$n$ shown in FIG. 3) and a plurality of resistors (for example, resistors R3_1, R3_2, ..., R3_$n$−1, R3_$n$ shown in FIG. 3). Voltages of each of first terminals of the resistors R3_1-R3_$n$ coupled to a common path A3 are, for example, the same as each other. Descriptions of the internal circuit 30, the common path A3, the transistor stack circuit 300, the signal transmission port SP31, the signal transmission port SP32, the resistors R3_1-R3_$n$ and the transistors M3_1-M3_$n$ shown in FIG. 3 may be deduced with reference to related descriptions of the internal circuit 20, the common path A2, the transistor stack circuit 200, the signal transmission port SP21, the signal transmission port SP22, the resistors R2_1-R2_$n$, and the transistors M2_1-M2_$n$, and details thereof are not repeated.

In the case where the transistor stack circuit 300 shown in FIG. 3 serves as the RF switch shunt path 130 shown in FIG. 1, the signal transmission port SP31 of the transistor stack circuit 300 is coupled to the RF connection pad RF2 and is coupled to the RF connection pad RFC through the RF switch series path 110. The signal transmission port SP32 is coupled to the reference voltage terminal REF1.

In the case where the transistor stack circuit 300 shown in FIG. 3 serves as the RF switch series path 110 shown in FIG. 1, the signal transmission port SP31 of the transistor stack circuit 300 is coupled to the RF connection pad RFC, and the signal transmission port SP32 is coupled to the RF switch shunt path 130. Namely, the signal transmission port SP32 is coupled to the reference voltage terminal REF1 through the RF switch shunt path 130.

When the ESD event occurs, the ESD voltage of the signal transmission port SP31 may be coupled to the gate of the transistor M3_1 through a parasitic capacitance between the gate and the drain of the transistor M3_1, thereby turning on the transistor M3_1 (since a voltage Vgs between the gate and source of the transistor M3_1 is greater than a threshold voltage). Different from the transistor stack circuit 200 shown in FIG. 2, the transistor stack circuit 300 shown in FIG. 3 further has the impedance unit 310. The impedance unit 310 is coupled between the common path A3 and a reference voltage terminal REF3. The resistor R3_1 and the impedance unit 310 form a voltage dividing circuit to divide a gate voltage of the transistor M3_1 (the ESD voltage of the signal transmission port SP31) to generate a divided voltage to the common path A3.

When the ESD event occurs, the above divided voltage of the common path A3 may turn on the transistors M3_2-M3_$n$ through the resistors R3_2-R3_$n$. For example, when the ESD event occurs, a voltage difference between the control terminal (such as the gate) of the transistor M3_2 and the second terminal (such as the source) of the transistor M3_2 is greater than a turn-on voltage (referring to threshold voltage) of the transistor M3_2, so that the transistor M3_2 (referring to the second transistor) is turned on. By appropriately adjusting a resistance ratio of the resistor R3_1 and the impedance unit 310, the voltage Vgs between the gate and the source of each of the transistors M3_2-M3_$n$ may be greater than the threshold voltage (referring to the respective turn-on voltage of the transistors M3_2-M3_$n$), thereby turning on each of the transistors M3_2-M3_$n$.

For example, based on an actual design, the impedance value of the impedance unit 310 is less than 10 MΩ. When the ESD event occurs, in some embodiments, the impedance value of the impedance unit 310 is greater than twice of the resistance value of each of the resistors R3_1-R3_$n$. In other embodiments, the number n of the transistors M3_1-M3_$n$ is greater than 10, and the impedance value of the impedance unit 310 is greater than 5 times of the resistance value of each of the resistors R3_1-R3_$n$. In some other embodiments, the number n of the transistors M3_1-M3_$n$ is greater than 40, and the impedance value of the impedance unit 310 is greater than 20 times of the resistance value of each of the resistors R3_1-R3_$n$. In addition, the impedance value of the impedance unit 310 may be an equivalent impedance value of the impedance unit 310 when the ESD event occurs.

Figure 12:
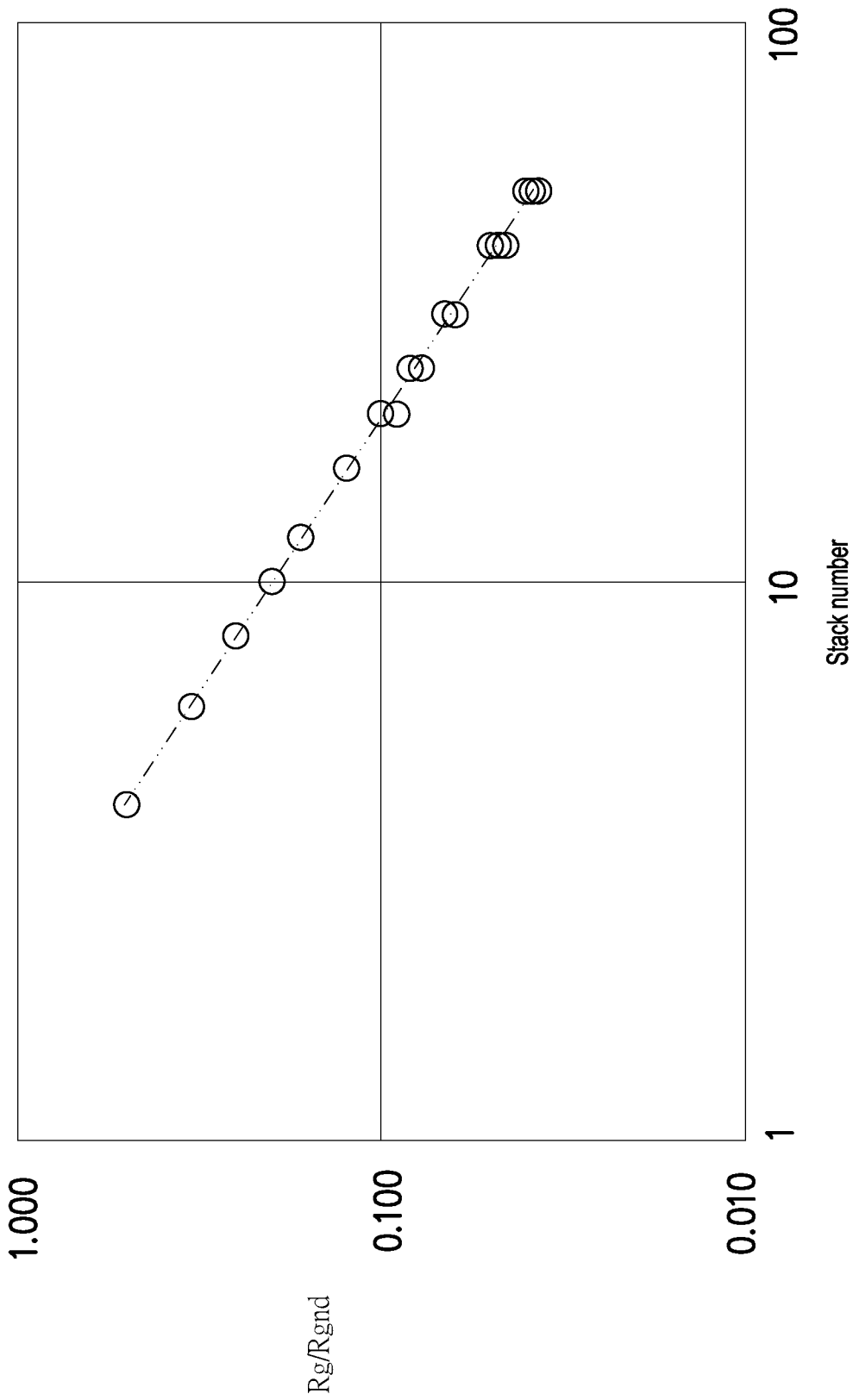
FIG. 12 is a schematic relationship curve diagram of a resistance ratio and a stack number of transistors according to an embodiment of the disclosure.

FIG. 12 is a schematic relationship curve diagram of a resistance ratio Rg/Rgnd and a stack number of transistors according to an embodiment of the disclosure. Referring to FIG. 3 and FIG. 12, FIG. 12 shows logarithmic coordinate axes, in which a horizontal axis of FIG. 12 represents the stack number n of the transistors M3_1 to M3_$n$, and a vertical axis represents the resistance ratio Rg/Rgnd. Where, Rg represents a resistance value of the resistor R3_1, and Rgnd represents a resistance value of the impedance unit 310. Based on the relationship curve shown in FIG. 12, the stack number n of the transistors M3_1-M3_$n$ has the corresponding resistance ratio Rg/Rgnd. By appropriately adjusting a ratio between the resistance value of the resistor R3_1 and the resistance value Rgnd of the impedance unit 310 (i.e., Rg/Rgnd), when the ESD event occurs, the voltage Vgs between the gate and the source of each of the transistors M3_2-M3_$n$ may be greater than the threshold voltage (referring to the respective turn-on voltage of the transistors M3_2-M3_$n$), thereby turning on each of the transistors M3_2-M3_$n$.

When the ESD event occurs, the divided voltage of the common path A3 may turn on each of the transistors M3_1-M3_$n$ to form a low-impedance path between the signal transmission port SP31 and the signal transmission port SP32. The turned-on transistors M3_1-M3_$n$ may transmit the ESD current between the signal transmission port SP31 and the signal transmission port SP32, so that the transistor stack circuit 300 may prevent ESD from damaging the integrated circuit.

Figure 4:
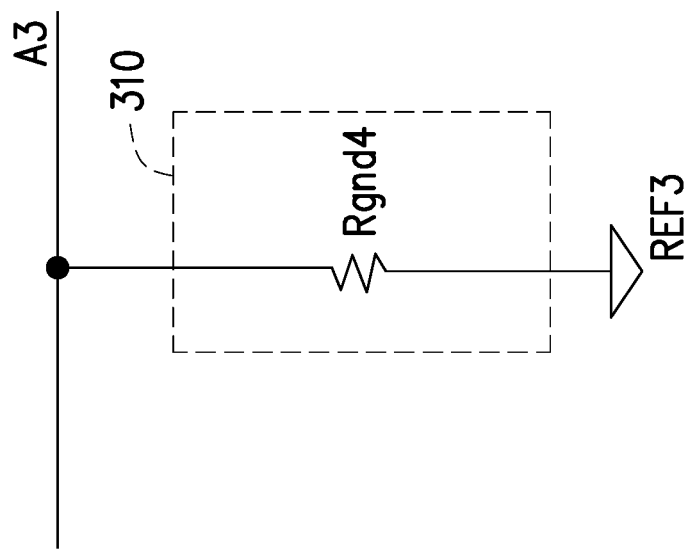
FIG. 4 is a schematic circuit diagram of an impedance unit according to an embodiment of the disclosure.

FIG. 4 is a schematic circuit diagram of the impedance unit 310 according to an embodiment of the disclosure. The impedance unit 310 shown in FIG. 4 may be used as one of many embodiments of the impedance unit 310 shown in FIG. 3. In the embodiment shown in FIG. 4, the impedance unit 310 includes a resistive element. The resistive element is, for example, an actual resistor Rgnd4, or may be another element equivalent to a resistor, such as an active element or an inductor, where the active element is, for example, a metal-oxide-semiconductor (MOS) (which may be an N-channel or a P-channel) transistor, a field-effect transistor (FET), a bipolar junction transistor (BJT), a heterojunction bipolar transistor (HBT) or a diode. A first terminal and a second terminal of the resistor Rgnd4 (referring to the resistive element) are respectively coupled to the common path A3 and the reference voltage terminal REF3. Referring to FIG. 3 and FIG. 4, the resistor R3_1 and the resistor Rgnd4 form a voltage dividing circuit to divide a gate voltage of the transistor M3_1 (the ESD voltage of the signal transmission port SP31) to generate a divided voltage to the common path A3. When the ESD event occurs, the divided voltage of the common path A3 may turn on the transistors M3_1-M3_n to form a low-impedance path between the signal transmission port SP31 and the signal transmission port SP32.

Figure 5:
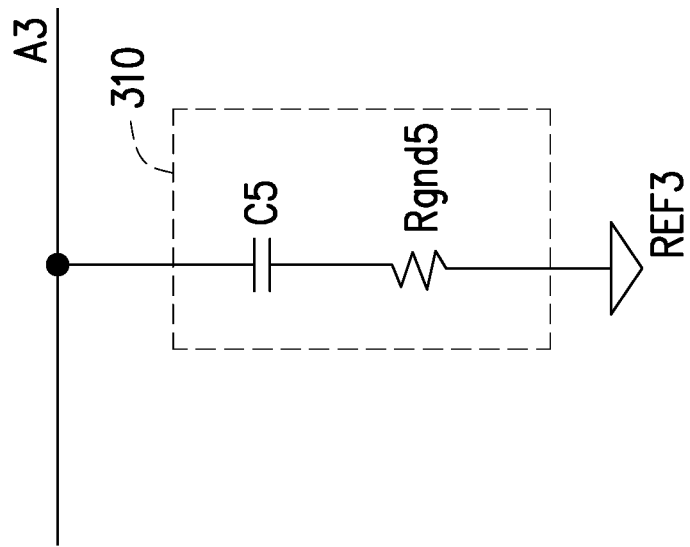
FIG. 5 is a schematic circuit diagram of an impedance unit according to another embodiment of the disclosure.

FIG. 5 is a schematic circuit diagram of an impedance unit 310 according to another embodiment of the disclosure. The impedance unit 310 shown in FIG. 5 may be used as one of many embodiments of the impedance unit 310 shown in FIG. 3. The impedance unit 310 shown in FIG. 5 includes a capacitor C5 and a resistive element. The resistive element is, for example, an actual resistor Rgnd5, or may be another element equivalent to a resistor, such as an active element or an inductor, where the active element is, for example, a metal-oxide-semiconductor (MOS) (which may be an N-channel or a P-channel) transistor, a field-effect transistor (FET), a bipolar junction transistor (BJT), a heterojunction bipolar transistor (HBT) or a diode. The capacitor C5 and the resistor Rgnd5 (referring to the resistive element) are connected in series between the common path A3 and the reference voltage terminal REF3. A product of a capacitance value of the capacitor C5 and a resistance value of the resistor Rgnd5 (referring to the resistive element) is greater than a duration of the ESD event, so that the transistor stack circuit 300 may transmit the ESD current within the duration of the ESD event. On the other hand, in an embodiment using an active element as the resistive component, the resistance value of the active element is an equivalent resistance when the ESD event occurs. In the embodiment shown in FIG. 5, a first terminal of the capacitor C5 is coupled to the common path A3, a second terminal of the capacitor C5 is coupled to a first terminal of the resistor Rgnd5, and a second terminal of the resistor Rgnd5 is coupled to the reference voltage terminal REF3. Different from the embodiment shown in FIG. 5, in another embodiment, the first terminal of the resistor Rgnd5 is coupled to the common path A3, the second terminal of the resistor Rgnd5 is coupled to the first terminal of the capacitor C5, and the second terminal of the capacitor C5 is coupled to the reference voltage terminal REF3. In yet another embodiment, the capacitor C5 and the resistor Rgnd5 (referring to the resistive element) may be connected in parallel between the common path A3 and the reference voltage terminal REF3. In addition, since the impedance unit 310 of the embodiment includes the capacitor C5, it may form an open circuit for low-frequency signals (such as DC signals) to prevent unexpected signal distortion.

Figure 6:
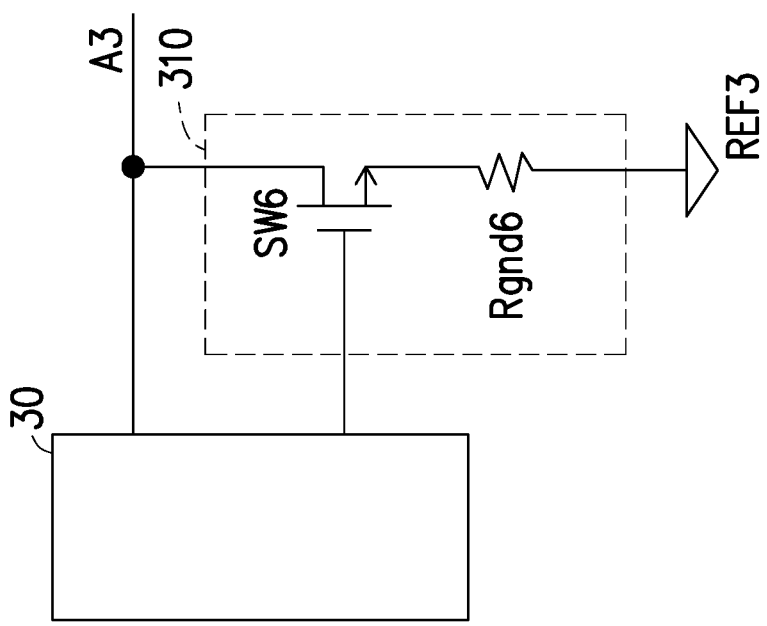
FIG. 6 is a schematic circuit diagram of an impedance unit according to still another embodiment of the disclosure.

FIG. 6 is a schematic circuit diagram of the impedance unit 310 according to still another embodiment of the disclosure. The impedance unit 310 shown in FIG. 6 may be used as one of many embodiments of the impedance unit 310 shown in FIG. 3. In the embodiment of FIG. 6, the impedance unit 310 includes a switch SW6 and a resistive element, where the resistive element is, for example, an actual resistor Rgnd6, or may be another element equivalent to a resistor, such as an active element or an inductor, where the active element is, for example, a metal-oxide-semiconductor (MOS) (which may be an N-channel or a P-channel) transistor, a field-effect transistor (FET), a bipolar junction transistor (BJT), a heterojunction bipolar transistor (HBT) or a diode. The resistor Rgnd6 (referring to the resistive element) and the switch SW6 are connected in series between the common path A3 and the reference voltage terminal REF3. In the embodiment shown in FIG. 6, a first terminal of the switch SW6 is coupled to the common path A3, a second terminal of the switch SW6 is coupled to a first terminal of the resistor Rgnd6, and a second terminal of the resistor Rgnd6 is coupled to the reference voltage terminal REF3. Different from the embodiment shown in FIG. 6, in another embodiment, the first terminal of the resistor Rgnd6 is coupled to the common path A3, the second terminal of the resistor Rgnd6 is coupled to the first terminal of the switch SW6, and the second terminal of the switch SW6 is coupled to the reference voltage terminal REF3. The switch SW6 is, for example, an N-channel metal-oxide-semiconductor transistor, a P-channel metal-oxide-semiconductor transistor, or other types of transistors. In the embodiment shown in FIG. 6, the switch SW6 is controlled by the internal circuit 30. In a normal operation mode, the switch SW6 is turned off, so that the impedance unit 310 will not affect a normal control of the internal circuit 30 to the transistor stack circuit 300. When the ESD event occurs, the switch SW6 is turned on. Furthermore, the impedance unit 310 of the embodiment includes the switch SW6, and the switch SW6 may modulate the impedance by changing a voltage and/or size to match the resistive element, since the switch SW6 may use a smaller area to achieve the required impedance, a circuit layout area is saved.

Figure 7:
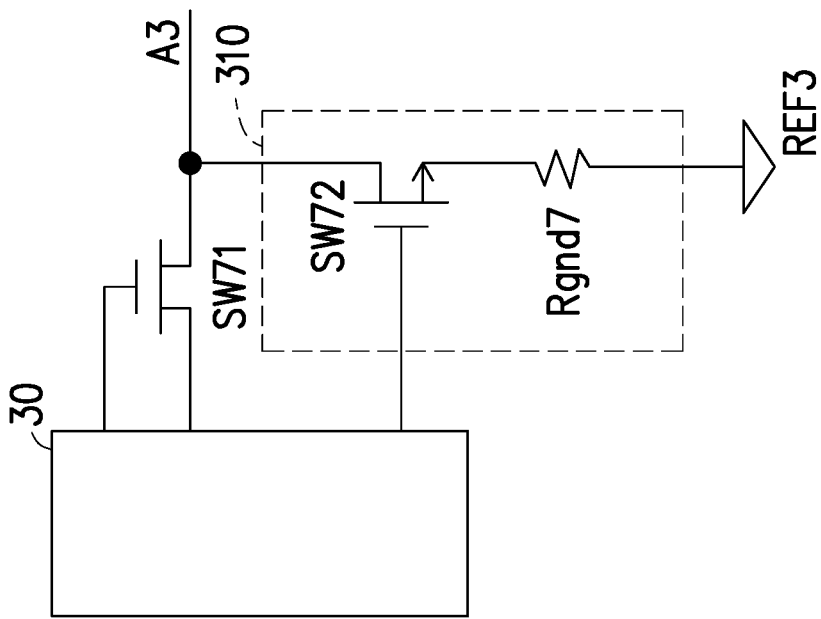
FIG. 7 is a schematic circuit diagram of an impedance unit according to yet another embodiment of the disclosure.

FIG. 7 is a schematic circuit diagram of the impedance unit 310 according to yet another embodiment of the disclosure. The impedance unit 310 shown in FIG. 7 may be used as one of many embodiments of the impedance unit 310 shown in FIG. 3. In the embodiment of FIG. 7, the transistor stack circuit 300 further includes a switch SW71, and the impedance unit 310 includes a switch SW72 and a resistive element, where the resistive element is, for example, an actual resistor Rgnd7, or may be another element equivalent to a resistor, such as an active element or an inductor, where the active element is, for example, a metal-oxide-semiconductor (MOS) (which may be an N-channel or a P-channel) transistor, a field-effect transistor (FET), a bipolar junction transistor (BJT), a heterojunction bipolar transistor (HBT) or a diode. The resistor Rgnd7 (referring to the resistive element) and the switch SW72 are connected in series between the common path A3 and the reference voltage terminal REF3. A first terminal of the switch SW71 is coupled between the common path A3 and the impedance unit 310. A second terminal of the switch SW71 is coupled to the internal circuit 30. In the embodiment shown in FIG. 7, a first terminal of the switch SW72 is coupled to the common path A3, a second terminal of the switch SW72 is coupled to a first terminal of the resistor Rgnd7, and a second terminal of the resistor Rgnd7 is coupled to the reference voltage terminal REF3. Different from the embodiment shown in FIG. 7, in another embodiment, the first terminal of the resistor Rgnd7 is coupled to the common path A3, the second terminal of the resistor Rgnd7 is coupled to the first terminal of the switch SW72, and the second terminal of the switch SW72 is coupled to the reference voltage terminal REF3. The switches SW71 and SW72 are, for example, N-channel metal-oxide-semiconductor transistors, P-channel metal-oxide-semiconductor transistors, or other types of transistors. In the embodiment shown in FIG. 7, the switches SW71 and SW72 are controlled by the internal circuit 30. In the normal operation mode, the switch SW72 is turned off, and the switch SW71 is turned on. Therefore, the impedance unit 310 will not affect a normal control of the internal circuit 30 to the transistor stack circuit 300. When the ESD event occurs, the switch SW72 is turned on, and the switch SW71 is turned off. Especially when the impedance of internal circuit 30 is low, arrangement of the switch SW71 may help blocking the ESD voltage or current.

Figure 8:
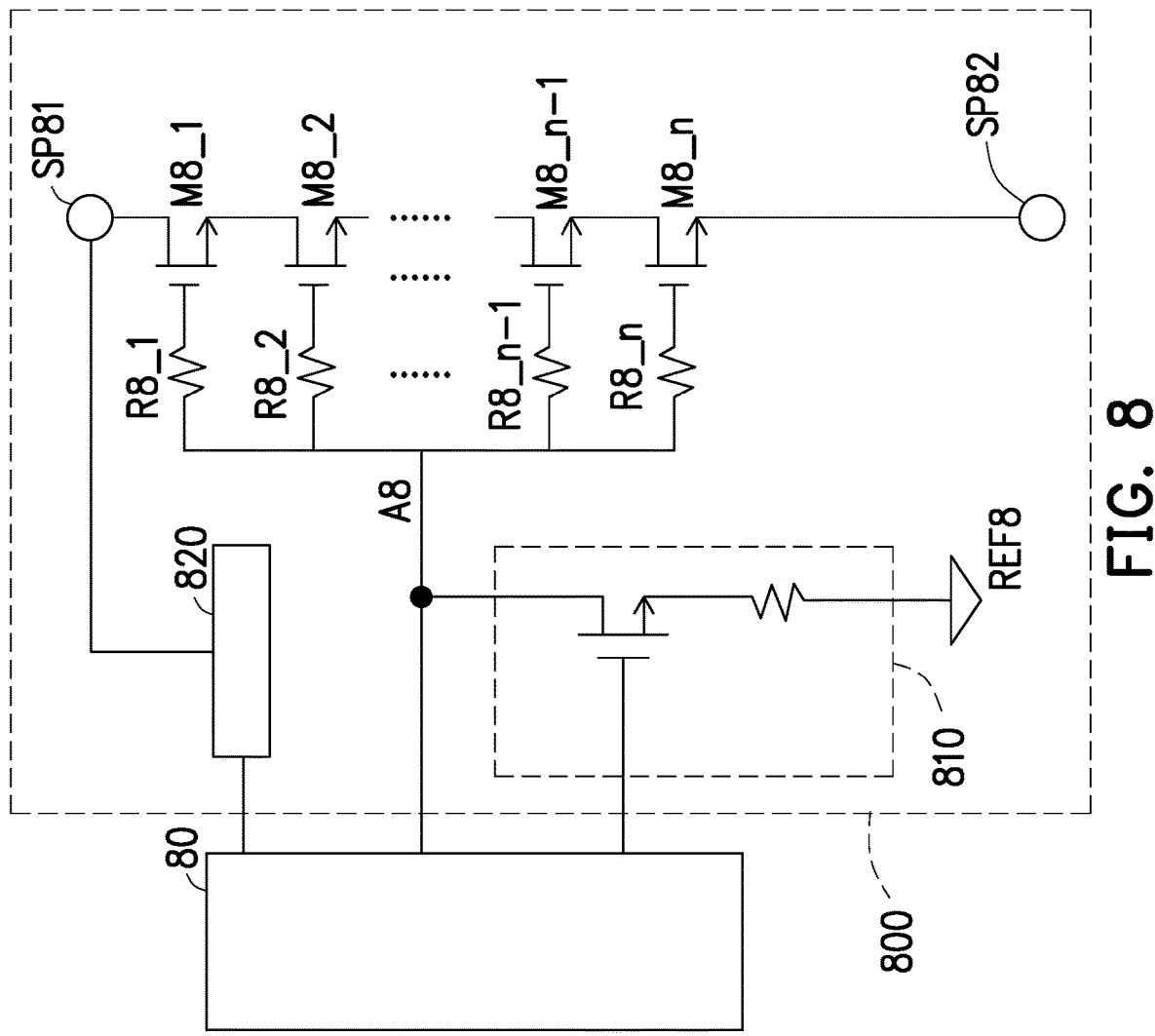
FIG. 8 is a schematic circuit diagram of a transistor stack circuit according to another embodiment of the disclosure.

FIG. 8 is a schematic circuit diagram of a transistor stack circuit 800 according to another embodiment of the disclosure. The transistor stack circuit 800 shown in FIG. 8 includes a signal transmission port SP81, a signal transmission port SP82, an impedance unit 810, an ESD (electrostatic discharge) detection circuit 820, a plurality of transistors (for example, transistors M8_1, M8_2, . . . , M8_$n$–1, M8_$n$ shown in FIG. 8) and a plurality of resistors (for example, resistors R8_1, R8_2, . . . , R8_$n$–1, R8_$n$ shown in FIG. 8). For the internal circuit 80, the signal transmission port SP81, the signal transmission port SP82, the impedance unit 810, a common path A8, the transistors M8_1-M8_$n$, the resistors R8_1-R8_$n$ and a reference voltage terminal REF8 shown in FIG. 8, reference may be made to the related descriptions of the internal circuit 30, the signal transmission port SP31, the signal transmission port SP32, the impedance unit 310, the common path A3, the transistors M3_1-M3_$n$, the resistors R3_1-R3_$n$ and the reference voltage terminal REF3 shown in FIG. 3, and details thereof are not repeated.

In the embodiment shown in FIG. 8, the ESD detection circuit 820 is coupled to the signal transmission port SP81. The ESD detection circuit 820 may detect an ESD event. When the ESD event occurs, the ESD detection circuit 820 is triggered, and the ESD detection circuit 820 provides a notification signal (indicating that an ESD event occurs) to the impedance unit 810, and the impedance unit 810 may immediately provide a current path between the common path A8 and the reference voltage terminals REF8, thereby turning on the transistors M8_1-M8_$n$. The turned-on transistors M8_1-M8_$n$ may transmit the ESD current between the signal transmission port SP81 and the signal transmission port SP82, so that the transistor stack circuit 800 may prevent ESD from damaging the integrated circuit. In the normal operation mode, the ESD detection circuit 820 is in a turned-off state, and the current path between the common path A8 and the reference voltage terminal REF8 is cut off.

Figure 9:
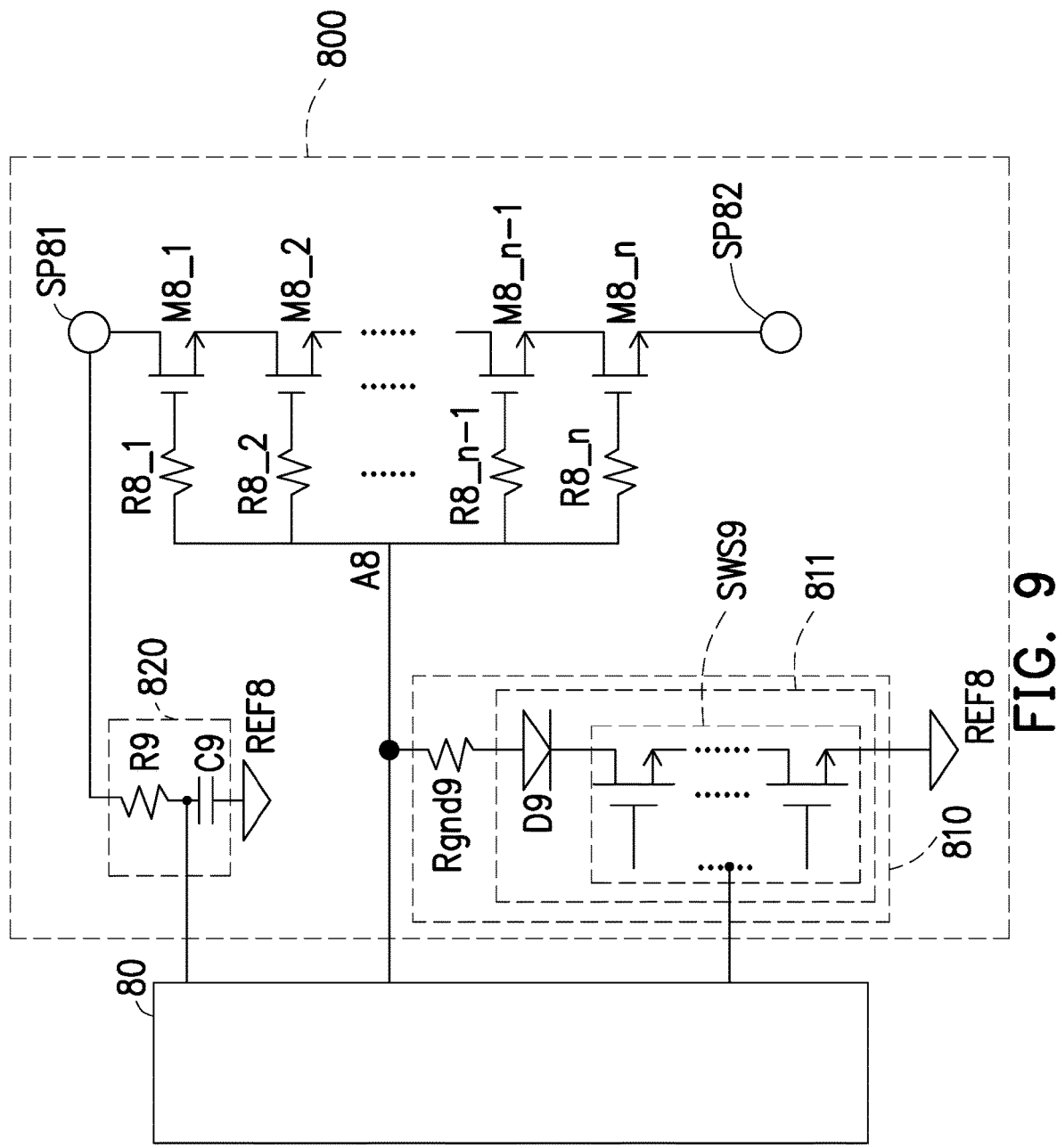
FIG. 9 is a schematic circuit diagram of an impedance unit and an ESD (electrostatic discharge) detection circuit according to an embodiment of the disclosure.

FIG. 9 is a schematic circuit diagram of the impedance unit 810 and the ESD (electrostatic discharge) detection circuit 820 according to an embodiment of the disclosure. The impedance unit 810 and the ESD detection circuit 820 shown in FIG. 9 may be used as one of many embodiments of the impedance unit 810 and the ESD detection circuit 820 shown in FIG. 8. In the embodiment shown in FIG. 9, the ESD detection circuit 820 is coupled between the signal transmission port SP81, the internal circuit 80 and the reference voltage terminal REF8, and the ESD detection circuit 820 includes a detection resistor R9 and a capacitor C9. The detection resistor R9 and the capacitor C9 are connected in series between the signal transmission port SP81 and the reference voltage terminal REF8. Furthermore, in the embodiment shown in FIG. 9, a first terminal of the detection resistor R9 is coupled to the signal transmission port SP81, a second terminal of the detection resistor R9 is coupled to a first terminal of the capacitor C9, and a second terminal of the capacitor C9 is coupled to the reference voltage terminal REF8. Different from the embodiment shown in FIG. 9, in another embodiment, the first terminal of the capacitor C9 is coupled to the signal transmission port SP81, the second terminal of the capacitor C9 is coupled to the first terminal of the detection resistor R9, and the second terminal of the detection resistor R9 is coupled to the reference voltage terminal REF8.

In the embodiment of FIG. 9, the impedance unit 810 includes a resistive element and a switch circuit 811, where the resistive element is, for example, an actual resistor Rgnd9, or may be another element equivalent to a resistor, such as an active element or an inductor, where the active element is, for example, a metal-oxide-semiconductor (MOS) (which may be an N-channel or a P-channel) transistor, a field-effect transistor (FET), a bipolar junction transistor (BJT), a heterojunction bipolar transistor (HBT) or a diode. The resistor Rgnd9 (referring to the resistive element) and the switch circuit 811 are connected in series between the common path A8 and the reference voltage terminal REF8. Further, in the embodiment of FIG. 9, a first terminal of the resistor Rgnd9 is coupled to the common path A8, a second terminal of the resistor Rgnd9 is coupled to a first terminal of the switch circuit 811, and a second terminal of the switch circuit 811 is coupled to the reference voltage terminal REF8. Different from the embodiment shown in FIG. 9, in another embodiment, the first terminal of the switch circuit 811 is coupled to the common path A8, the second terminal of the switch circuit 811 is coupled to the first terminal of the resistor Rgnd9, and the second terminal of the resistor Rgnd9 is coupled to the reference voltage terminal REF8. In the embodiment shown in FIG. 9, the switch circuit 811 is controlled by the internal circuit 80. In a normal operation mode, the switch circuit 811 is off. Therefore, the impedance unit 810 will not affect a normal control of the internal circuit 80 to the transistor stack circuit 800. When an ESD event occurs, the switch circuit 811 is turned on.

In the embodiment shown in FIG. 9, the switch circuit 811 includes a switch series SWS9 and a diode D9. The switch series SWS9 and the diode D9 are connected in series between the resistor Rgnd9 and the reference voltage terminal REF8. For example, in the embodiment shown in FIG. 9, an anode of the diode D9 is coupled to the resistor Rgnd9, a cathode of the diode D9 is coupled to a first terminal of the switch series SWS9, and a second terminal of the switch series SWS9 is coupled to the reference voltage terminal REF8. A common control terminal of the switch series SWS9 is coupled to the internal circuit 80. In the normal operation mode, the switch series SWS9 is turned off. When the ESD event occurs, the switch series SWS9 is turned on. The switch series SWS9 includes, for example, a plurality of transistors connected in series. These transistors are, for example, N-channel metal-oxide-semiconductor transistors, P-channel metal-oxide-semiconductor transistors or other types of transistors. The switch series SWS9 may be coupled to the ESD detection circuit 820 and the signal transmission port SP81 through the internal circuit 80. In this way, control signals for controlling the ESD detection circuit 820 and the switch series SWS9 may all come from the signal transmission port SP81, so that a control logic of the switch series SWS9 is clearer, and accordingly the transistor stack circuit 800 may operate smoothly when the ESD event occurs. Furthermore, in another embodiment in which the first terminal of the switch circuit 811 is coupled to the common path A8, the anode of the diode D9 is coupled to the common path A8.

Figure 10:
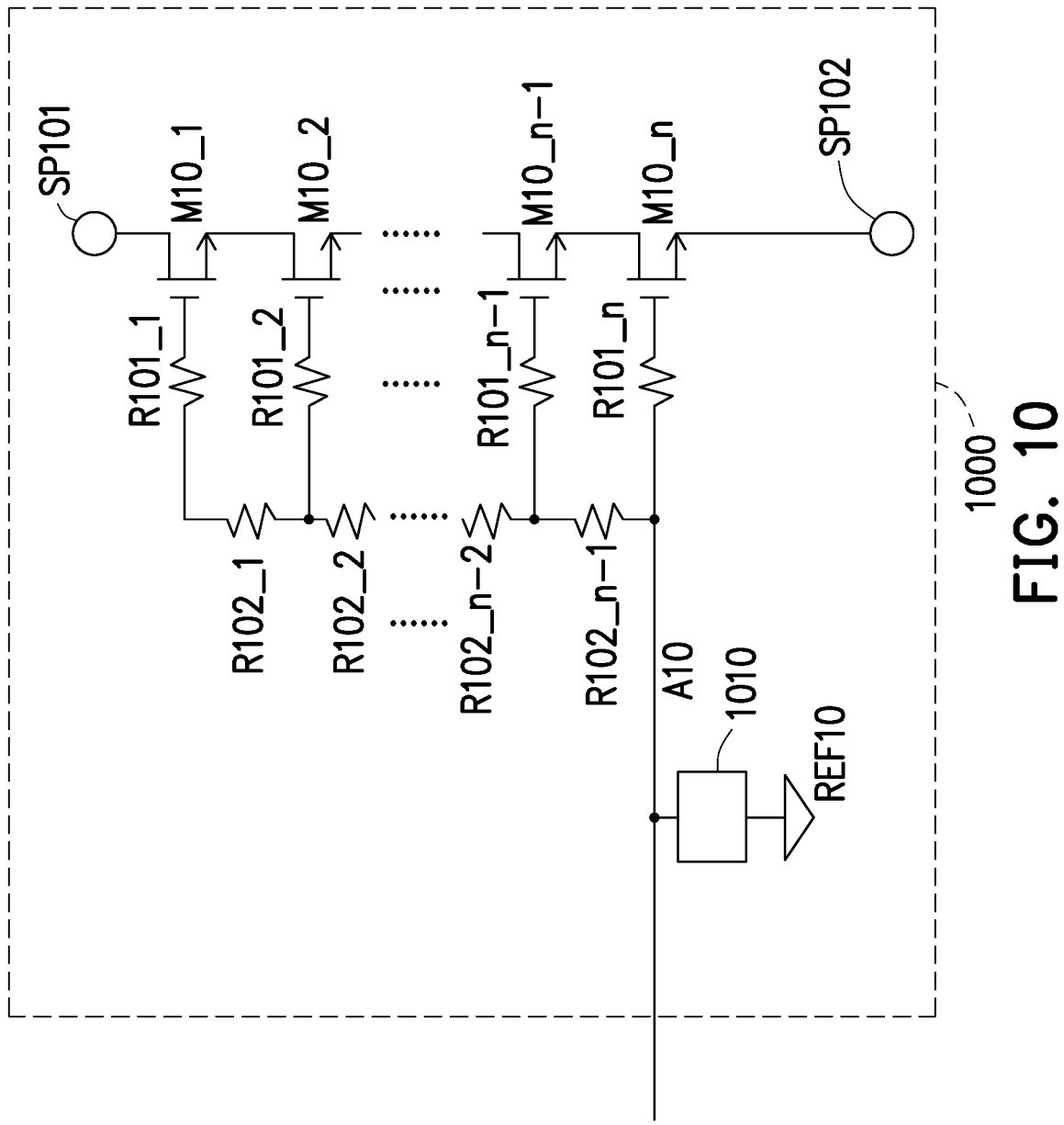
FIG. 10 is a schematic circuit diagram of a transistor stack circuit according to still another embodiment of the disclosure.

FIG. 10 is a schematic circuit diagram of a transistor stack circuit 1000 according to still another embodiment of the disclosure. The transistor stack circuit 1000 shown in FIG. 8 includes a signal transmission port SP101, a signal transmission port SP102, an impedance unit 1010, a plurality of transistors (for example, transistors M10_1, M10_2, ..., M10_$n$–1, M10_$n$ shown in FIG. 10) and a plurality of resistors (for example, resistors R101_1, R101_2, ..., R101_$n$–1, R101_$n$ shown in FIG. 10). For the transistor stack circuit 1000, the signal transmission port SP101, the signal transmission port SP102, the impedance unit 1010, a common path A10, the transistors M10_1-M10_$n$, the resistors R101_1-R101_$n$ and a reference voltage terminal REF10 shown in FIG. 10, reference may be made to the related descriptions of the transistor stack circuit 300, the signal transmission port SP31, the signal transmission port SP32, the impedance unit 310, the common path A3, the transistors M3_1-M3_$n$, the resistors R3_1-R3_$n$ and the reference voltage terminal REF3 shown in FIG. 3, and details thereof are not repeated.

Different from the transistor stack circuit 300 shown in FIG. 3, the transistor stack circuit 1000 shown in FIG. 10 further includes resistors R102_1, R102_2, ..., R102_$n$–2, R102_$n$–1. Each of the resistors R102_1-R102_$n$–1 is coupled between the first terminals of two adjacent corresponding resistors in the resistors R101_1-R101_$n$. For example, the resistor R102_1 is coupled between the first terminals of two adjacent corresponding resistors R101_1 and R101_2. Deduced by analogy, the resistor R102_$n$–1 is coupled between the first terminals of two adjacent corresponding resistors R101_$n$–1 and R101_$n$. In the embodiment shown in FIG. 10, for example, resistors (referring to the resistors R102_1, R102_2, ..., R102_$n$–2, R102_$n$–1) are provided between the first terminals of all two adjacent corresponding resistors. In the framework of the transistor stack circuit 1000 in FIG. 10, a plurality of nodes are formed between the resistors R102_1, R102_2, ..., R102_$n$–2, and R102_$n$–1. These nodes correspond to control terminals (such as gates) of the transistors M10_1-M10_$n$, and divided voltages may be respectively formed at these nodes rather than being formed at the common path A3 of the transistor stack circuit 300 as shown in the embodiment of FIG. 3. The individual divided voltages on these nodes of the transistor stack circuit 1000 are smaller than the divided voltage on the common path A3 of the transistor stack circuit 300. In comparison, the transistor stack circuit 1000 may provide a more uniform voltage division effect, so that a difference of the voltages Vgs between the gate and source of two adjacent transistors in the transistors M10_1-M10_$n$ is smaller, and when an ESD event occurs, the transistors M10_1-M10_$n$ may be turned on more uniformly.

Figure 11:
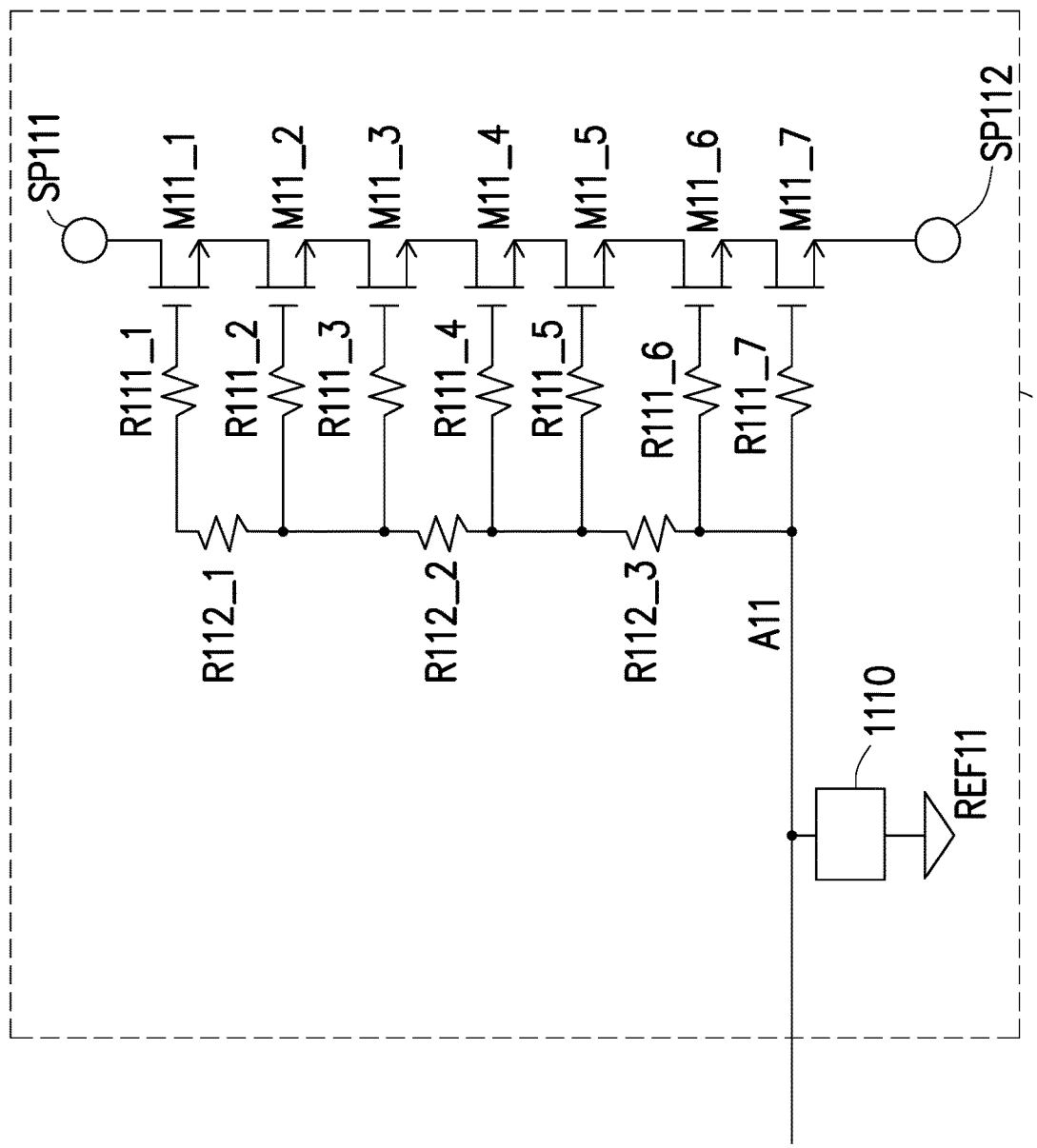
FIG. 11 is a schematic circuit diagram of a transistor stack circuit according to yet another embodiment of the disclosure.

FIG. 11 is a schematic circuit diagram of a transistor stack circuit 1100 according to yet another embodiment of the disclosure. The transistor stack circuit 1100 shown in FIG. 11 includes a signal transmission port SP111, a signal transmission port SP112, an impedance unit 1110, a transistor M11_1, a transistor M11_2, a transistor M11_3, a transistor M11_4, a transistor M11_5, a transistor M11_6, and a transistor M11_7, a resistor R111_1, a resistor R111_2, a resistor R111_3, a resistor R111_4, a resistor R111_5, a resistor R111_6 and a resistor R111_7. For the transistor stack circuit 1100, the signal transmission port SP111, the signal transmission port SP112, the impedance unit 1110, a common path A11, the transistors M11_1-M11_7, the resistors R111_1-R111_7 and a reference voltage terminal REF11 shown in FIG. 11, reference may be made to related descriptions of the transistor stack circuit 300, the signal transmission port SP31, the signal transmission port SP32, the impedance unit 310, the common path A3, the transistors M3_1-M3_$n$, the resistors R3_1-R3_$n$, and the reference voltage terminal REF3, and details thereof are not repeated. A difference from the transistor stack circuit 300 shown in FIG. 3 is that the transistor stack circuit 1100 shown in FIG. 11 further includes resistors R112_1, R112_2 and R112_3. Each of the resistors R112_1-R112_3 is coupled between the first terminals of two adjacent corresponding resistors in the resistors R111_1-R111_7. For example, the resistor R112_2 is coupled between the first terminals of the two corresponding resistors R111_3 and R111_4 that are adjacent to each other. In the embodiment shown in FIG. 11, resistors (referring to the resistors R112_1, R112_2 and R112_3) are not necessarily provided between the first terminals of all adjacent two corresponding resistors, but may be, for example provided at intervals. In the framework of the transistor stack circuit 1100 in FIG. 11, a plurality of nodes are formed between the resistors R112_1, R112_2 and R112_3, and these nodes correspond to control terminals (such as gates) of the transistors M11_1-M11_7, and divided voltages may be respectively formed at these nodes rather than being formed at the common path A3 of the transistor stack circuit 300 as shown in the embodiment of FIG. 3. The individual divided voltages on these nodes of the transistor stack circuit 1100 are smaller than the divided voltage on the common path A3 of the transistor stack circuit 300. In comparison, the transistor stack circuit 1100 may provide a more uniform voltage division effect, so that a difference of the voltages Vgs between the gate and source of two adjacent transistors in the transistors M11_1-M11_7 is smaller, and when an ESD event occurs, the transistors M11_1-M11_7 may be turned on more uniformly.

In summary, the impedance unit described in the embodiments of the disclosure may effectively turn on each of the transistors connected in series (transistor stack) when an ESD event occurs, thereby allowing the transistors to transmit an ESD current between the first signal transmission port and the second signal transmission port. Therefore, the transistor stack circuit may prevent ESD from damaging the integrated circuit.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A transistor stack circuit, comprising:
   a first signal transmission port;
   a second signal transmission port;
   a plurality of transistors, connected in series to each other, and coupled between the first signal transmission port and the second signal transmission port;
   a plurality of first resistors, wherein each of the first resistors has a first terminal and a second terminal, the first terminals are coupled to a common path, and each of the second terminals is coupled to a control terminal of a corresponding transistor among the transistors; and
an impedance unit, coupled between the common path and a reference voltage terminal, wherein
when an electrostatic discharge event occurs, an impedance value of the impedance unit is greater than twice of a resistance value of each of the first resistors, and the transistors form a low-impedance path.

2. The transistor stack circuit as claimed in claim 1, wherein the impedance value of the impedance unit is less than 10 MΩ.

3. The transistor stack circuit as claimed in claim 1, wherein a number of the transistors is greater than 40, and the impedance value of the impedance unit is greater than 20 times of the resistance value of each of the first resistors.

4. The transistor stack circuit as claimed in claim 1, wherein a number of the transistors is greater than 10, and the impedance value of the impedance unit is greater than 5 times of the resistance value of each of the first resistors.

5. The transistor stack circuit as claimed in claim 1, wherein the impedance unit comprises:
a resistive element, having a first terminal and a second terminal respectively coupled to the common path and the reference voltage terminal.

6. The transistor stack circuit as claimed in claim 1, wherein the impedance unit comprises:
a capacitor; and
a resistive element, wherein the capacitor and the resistive element are connected in series or in parallel to each other between the common path and the reference voltage terminal,
wherein a product of a capacitance value of the capacitor and a resistance value of the resistive element is greater than a duration of the electrostatic discharge event.

7. The transistor stack circuit as claimed in claim 1, wherein the impedance unit comprises:
a resistive element; and
a first switch, wherein the resistive element and the first switch are connected in series between the common path and the reference voltage terminal.

8. The transistor stack circuit as claimed in claim 7, wherein
in a normal operation mode, the first switch is turned off; and
when the electrostatic discharge event occurs, the first switch is turned on.

9. The transistor stack circuit as claimed in claim 7, further comprising:
a second switch, wherein a first terminal of the second switch is coupled between the common path and the impedance unit, and a second terminal of the second switch is coupled to an internal circuit.

10. The transistor stack circuit as claimed in claim 9, wherein
in a normal operation mode, the first switch is turned off, and the second switch is turned on; and
when the electrostatic discharge event occurs, the first switch is turned on, and the second switch is turned off.

11. The transistor stack circuit as claimed in claim 1, further comprising:
an electrostatic discharge detection circuit, coupled to the first signal transmission port for detecting the electrostatic discharge event, wherein
when the electrostatic discharge event occurs, the impedance unit provides a current path between the common path and the reference voltage terminal, and
in a normal operation mode, the current path is cut off.

12. The transistor stack circuit as claimed in claim 11, wherein the electrostatic discharge detection circuit is coupled between the first signal transmission port, an internal circuit, and the reference voltage terminal, and the electrostatic discharge detection circuit comprises:
a detection resistor; and
a capacitor, wherein the detection resistor and the capacitor are connected in series between the first signal transmission port and the reference voltage terminal.

13. The transistor stack circuit as claimed in claim 11, wherein the impedance unit comprises:
a resistive element; and
a switch circuit, wherein the resistive element and the switch circuit are connected in series between the common path and the reference voltage terminal.

14. The transistor stack circuit as claimed in claim 13, wherein the switch circuit comprises:
a switch series, having a common control terminal coupled to an internal circuit, wherein the switch series is turned off in the normal operation mode, and the switch series is turned on when the electrostatic discharge event occurs; and
a diode, having a cathode coupled to the switch series.

15. The transistor stack circuit as claimed in claim 1, wherein the transistors comprise:
a first transistor;
a second transistor; and
a terminal transistor, wherein a first terminal of the first transistor is coupled to the first signal transmission port, a second terminal of the first transistor is coupled to a first terminal of the second transistor, a second terminal of the terminal transistor is coupled to the second signal transmission port, and when the electrostatic discharge event occurs, the second transistor is turned on.

16. The transistor stack circuit as claimed in claim 1, wherein a voltage of each of the first terminals of the first resistors coupled to the common path is the same.

17. The transistor stack circuit as claimed in claim 1, further comprising:
a plurality of third resistors, wherein each of the third resistors is coupled between the first terminals of two corresponding first resistors that are adjacent to each other among the first resistors.

18. The transistor stack circuit as claimed in claim 1, wherein the transistor stack circuit is a radio frequency switch shunt path, the first signal transmission port is coupled to a radio frequency connection pad, and the second signal transmission port is coupled to the reference voltage terminal.

19. The transistor stack circuit as claimed in claim 1, wherein the transistor stack circuit is a radio frequency switch series path, the first signal transmission port is coupled to a radio frequency connection pad, and the second signal transmission port is coupled to a radio frequency switch shunt path.

20. A transistor stack circuit, comprising:
a first signal transmission port;
a second signal transmission port;
a plurality of transistors, connected in series to each other, and coupled between the first signal transmission port and the second signal transmission port, wherein the transistors comprise a first transistor, a second transistor, and a terminal transistor, a first terminal of the first transistor is coupled to the first signal transmission port, a second terminal of the first transistor is coupled to a first terminal of the second transistor, and a second terminal of the terminal transistor is coupled to the second signal transmission port;

a plurality of first resistors, wherein each of the first resistors has a first terminal and a second terminal, wherein the first terminals are coupled to a common path, and each of the second terminals is coupled to a control terminal of a corresponding transistor among the transistors; and an impedance unit, coupled between the common path and a reference voltage terminal, wherein when an electrostatic discharge event occurs, a voltage difference between a control terminal of the second transistor and a second terminal of the second transistor is greater than a turn-on voltage of the second transistor.

* * * * *